US008486609B2

(12) United States Patent
Rahman et al.

(10) Patent No.: US 8,486,609 B2
(45) Date of Patent: Jul. 16, 2013

(54) ANTIREFLECTIVE COATING COMPOSITION AND PROCESS THEREOF

(75) Inventors: M. Dalil Rahman, Flemington, NJ (US); Douglas McKenzie, Easton, PA (US); Huirong Yao, Plainsboro, NJ (US); JoonYeon Cho, Bridgewater, NJ (US); Yi Yl, Somerville, NJ (US); Guanyang Lin, Whitehouse Station, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 682 days.

(21) Appl. No.: 12/646,191

(22) Filed: Dec. 23, 2009

(65) Prior Publication Data

US 2011/0151376 A1     Jun. 23, 2011

(51) Int. Cl.
*G03F 7/32* (2006.01)
*G03F 7/11* (2006.01)
*C08G 65/48* (2006.01)
*C09D 165/00* (2006.01)

(52) U.S. Cl.
USPC ............... 430/311; 430/271.1; 430/272.1; 430/325; 430/326; 525/534

(58) Field of Classification Search
None
See application file for complete search history.

(56) References Cited

U.S. PATENT DOCUMENTS

| | | | |
|---|---|---|---|
| 3,474,054 A | 10/1969 | White | |
| 3,474,058 A | 10/1969 | Ridgeway et al. | |
| 4,200,729 A | 4/1980 | Calbo | |
| 4,251,665 A | 2/1981 | Calbo | |
| 4,463,162 A | 7/1984 | Nogami et al. | |
| 4,491,628 A | 1/1985 | Ito et al. | |
| 4,719,166 A | 1/1988 | Blevins et al. | |
| 5,187,019 A | 2/1993 | Calbo et al. | |
| 5,294,680 A | 3/1994 | Knors et al. | |
| 5,350,660 A | 9/1994 | Urano et al. | |

(Continued)

FOREIGN PATENT DOCUMENTS

CN     1847274 A     10/2006
EP     0 845 486 A1   6/1998

(Continued)

OTHER PUBLICATIONS

English translation of JP 2009-014816, A (2009) from machine translation from AIPN Japan Patent Office National Center for Industrial Property Information and Training, generated Jul. 6, 2012, 30 pages.*

(Continued)

*Primary Examiner* — Cynthia Hamilton
(74) *Attorney, Agent, or Firm* — Sangya Jain

(57) ABSTRACT

The invention relates to an antireflective coating composition comprising a crosslinker and a crosslinkable polymer capable of being crosslinked by the crosslinker, where the crosslinkable polymer comprises a unit represented by structure (1):

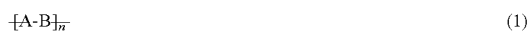

$\mathrm{\{A\text{-}B\}}_n$     (1)

where A is a fused aromatic ring and B has a structure (2),

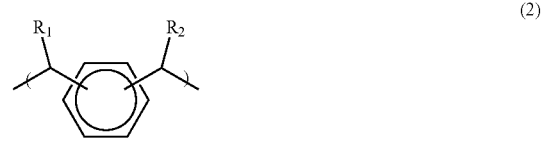

(2)

where $R_1$ is $C_1$-$C_4$alkyl and $R_2$ is $C_1$-$C_4$alkyl. The invention further relates to a process for forming an image using the composition.

17 Claims, 1 Drawing Sheet

Imaging Process of a Trilayer

U.S. PATENT DOCUMENTS

| | | | |
|---|---|---|---|
| 5,607,824 A | 3/1997 | Fahey et al. |
| 5,688,598 A | 11/1997 | Keck et al. |
| 5,747,599 A | 5/1998 | Ohnishi |
| 5,843,624 A | 12/1998 | Houlihan et al. |
| 5,935,760 A | 8/1999 | Shao et al. |
| 5,965,679 A | 10/1999 | Godschalx et al. |
| 5,981,145 A | 11/1999 | Ding et al. |
| 6,048,956 A | 4/2000 | Muto et al. |
| 6,121,495 A | 9/2000 | Babb et al. |
| 6,165,684 A | 12/2000 | Mizutani et al. |
| 6,228,552 B1 | 5/2001 | Okino et al. |
| 6,255,394 B1 | 7/2001 | Onizawa |
| 6,268,072 B1 | 7/2001 | Zheng et al. |
| 6,316,165 B1 | 11/2001 | Pavelchek et al. |
| 6,410,208 B1 | 6/2002 | Teng |
| 6,447,980 B1 | 9/2002 | Rahman et al. |
| 6,723,488 B2 | 4/2004 | Kudo et al. |
| 6,730,454 B2 | 5/2004 | Pfeiffer et al. |
| 6,737,492 B2 | 5/2004 | Kang et al. |
| 6,783,916 B2 | 8/2004 | Foster et al. |
| 6,790,587 B1 | 9/2004 | Feiring et al. |
| 6,803,168 B1 | 10/2004 | Padmanaban et al. |
| 6,818,258 B2 | 11/2004 | Kaneko et al. |
| 6,849,377 B2 | 2/2005 | Feiring et al. |
| 6,866,984 B2 | 3/2005 | Jung et al. |
| 6,899,963 B1 | 5/2005 | Zheng et al. |
| 6,916,590 B2 | 7/2005 | Kaneko et al. |
| 7,132,216 B2 | 11/2006 | Shao et al. |
| 7,214,743 B2 | 5/2007 | Hatakeyama et al. |
| 7,264,913 B2 | 9/2007 | Wu et al. |
| 7,303,855 B2 | 12/2007 | Hatakeyama et al. |
| 7,749,681 B2 | 7/2010 | Yoshimura et al. |
| 7,816,071 B2 | 10/2010 | Abdallah et al. |
| 7,932,018 B2 | 4/2011 | McKenzie et al. |
| 7,989,144 B2 | 8/2011 | Rahman et al. |
| 8,017,296 B2 | 9/2011 | Houlihan et al. |
| 2001/0006759 A1 | 7/2001 | Shipley et al. |
| 2002/0094382 A1 | 7/2002 | Imai et al. |
| 2003/0180559 A1 | 9/2003 | Wayton et al. |
| 2004/0219453 A1 | 11/2004 | Pavelchek et al. |
| 2005/0007016 A1 | 1/2005 | Mori et al. |
| 2005/0058929 A1 | 3/2005 | Kennedy et al. |
| 2005/0095434 A1 | 5/2005 | Hirota et al. |
| 2005/0186444 A1 | 8/2005 | Zheng et al. |
| 2005/0282091 A1 | 12/2005 | Hatakeyama |
| 2006/0177774 A1 | 8/2006 | Abdallah et al. |
| 2006/0204891 A1 | 9/2006 | Hatakeyama |
| 2006/0222999 A1 | 10/2006 | Miyazaki et al. |
| 2006/0234158 A1 | 10/2006 | Hatakeyama |
| 2006/0275696 A1 | 12/2006 | Zampini et al. |
| 2007/0057253 A1 | 3/2007 | Gronbeck et al. |
| 2007/0287298 A1 | 12/2007 | Ishibashi et al. |
| 2008/0160461 A1 | 7/2008 | Yoon et al. |
| 2008/0292987 A1 | 11/2008 | Houlihan et al. |
| 2008/0292995 A1 | 11/2008 | Houlihan et al. |
| 2008/0305441 A1 | 12/2008 | Yoon et al. |
| 2009/0176165 A1 | 7/2009 | Cheon et al. |
| 2009/0246691 A1 | 10/2009 | Rahman et al. |
| 2009/0280435 A1 | 11/2009 | McKenzie et al. |
| 2010/0119979 A1 | 5/2010 | Rahman et al. |
| 2010/0119980 A1 | 5/2010 | Rahman et al. |
| 2010/0151392 A1 | 6/2010 | Rahman et al. |
| 2010/0316949 A1 | 12/2010 | Rahman et al. |

FOREIGN PATENT DOCUMENTS

| | | |
|---|---|---|
| EP | 0 933 681 A1 | 8/1999 |
| EP | 1 035 442 A2 | 9/2000 |
| EP | 1 085 529 A2 | 3/2001 |
| EP | 1 705 519 A2 | 9/2006 |
| EP | 1 829 942 A1 | 9/2007 |
| EP | 1 845 416 A2 | 10/2007 |
| JP | 62-230843 A | 10/1987 |
| JP | 63-51419 A | 3/1988 |
| JP | 8-73570 A | 3/1996 |
| JP | 8-301980 A | 11/1996 |
| JP | 10-273635 A | 10/1998 |
| JP | 11-249311 A | 9/1999 |
| JP | 2002-14474 A | 1/2002 |
| JP | 2003-82070 A | 3/2003 |
| JP | 2004-205676 A | 7/2004 |
| JP | 2005-43471 A | 2/2005 |
| JP | 2009-14816 A | 1/2009 |
| WO | WO 2008/082241 A1 | 7/2008 |
| WO | WO 2008/120855 A1 | 10/2008 |

OTHER PUBLICATIONS

English translation of JP 08-073570, A (1996) from machine translation from AIPN Japan Patent Office National Center for Industrial Property Information and Training, generated Jul. 6, 2012, 7 pages.*
Woollam et al , Critical Reviews of Optical Science and Technology vol. CR72 (proceedings of a conference held Jul. 18-19, 1999 in Dever, Coloradoe , copyright SPIE 1999, obtained from http://www.lot-oriel.com/files/downloads/woollam/en/el_vaseoverview1_deen.pdf 28 pages total.*
Notification of First Office Action dated Jan. 11, 2012 for Chinese Patent Application No. 200880016844.8, which corresponds to U.S. Appl. No. 11/872,962.
Eng. Lang. Translation of Notification of First Office Action dated Jan. 11, 2012 for Chinese Patent Application No. 200880016844.8, which corresponds to U.S. Appl. No. 11/872,962.
Notice of Allowance and Fee(s) Due date mailed Dec. 23, 2010 for U.S. Appl. No. 12/115,776.
Notice of Allowance and Fee(s) Due date mailed Mar. 25, 2010 for U.S. Appl. No. 12/060,307.
Final Office Action mail date Mar. 22, 2011 for U.S. Appl. No. 12/270,189.
Office Action mail date Jan. 14, 2011 for U.S. Appl. No. 12/270,256.
Office Action mail date Dec. 23, 2010 for U.S. Appl. No. 12/482,189.
Eng. Lang. Abstract of XP002503793 retrieved from STN Database accession No. 1999:587958, Database CA [Online] Chemical Abstracts Services, Columbus, Ohio, USA, (Sep. 20, 1999).
English Language Abstract of XP002503795 retrieved from Database WPI Week accession No. 1999-57548 [49], Thomson Scientific, London, GB (1999).
English Language Abstract from JPO of JP 62-230843 A, downloaded Mar. 25, 2010.
Eng. Lang. Abstract of XP0025003794 retrieved from STN Database Accession No. 1988: 205733, Database CA [Online] Chemical Abstracts Services, Columbus, Ohio, USA, (Jun. 11, 1998).
English Language Abstract from JPO of JP 63-51419 A, down loaded Apr. 10, 2008.
Engl. Lang. Abstract of XP002504600 retrieved from STN Database Accession No. 2002:47842, Database CA [Online] Chemical Abstracts Services, Columbus, Ohio, USA, (Jan. 18, 2002).
Office Action mail date Mar. 6, 2010 for U.S. Appl. No. 11/752,040.
Office Action mail date Dec. 16, 2009 for U.S. Appl. No. 11/872,962.
Office Action mail date Dec. 23, 2009 for U.S. Appl. No. 12/115,776.
Office Action mail date Dec. 7, 2009 for U.S. Appl. No. 12/060,307.
Form PCT/ISA/220, Form PCT/ISA/210, and Form PCT/ISA/237 for PCT/IB2008/001284 dated Dec. 2, 2008, which corresponds to U.S. Appl. No. 11/872,962.
Form PCT/IB/326, Form PCT/IB/373, and Form PCT/ISA/237 for PCT/IB2008/001284 dated Dec. 3, 2008, which corresponds to U.S. Appl. No. 11/872,962.
Form PCT/ISA/220, Form PCT/ISA/210, and Form PCT/ISA/237 for PCT/IB2009/005147 dated Jul. 22, 2009, which corresponds to U.S. Appl. No. 12/115,776.
Form PCT/ISA/220, Form PCT/ISA/210, and Form PCT/ISA/237 for PCT/IB2009/005186 dated Jul. 14, 2009, which corresponds to U.S. Appl. No. 12/270,189.
Form PCT/ISA/220, Form PCT/ISA/210, and Form PCT/ISA/237 for PCT/IB2009/005185 dated Jul. 14, 2009, which corresponds to U.S. Appl. No. 12/270,256.
Guo, et al., "Nanoimprint Lithography: Methods and Material Requirements**", Advanced Materials, vol. 19, No. 4, pp. 495-813, published online Jan. 25, 2007 at http://www3.interscience.wiley.com/journal/114096023/abstract.
H. Harada et al., "Progress of Hard Mask Material for Multi-layer stack application", SPIE vol. 6519, pp. 65190N-1-65190N-9 (2007).

Nishimura et al., Comparison of single-, bi-, and tri-layer resist process, SPIE vol. 5753, pp. 611-618 (2005).
Notification of the First Office Action for CN200981 16266.x dated Feb. 16, 2012, which corresponds to U.S. Appl. No. 12/115,776.
English Language Translation of Notification of the First Office Action for CN20098116266.x dated Feb. 16, 2012, which corresponds to U.S. Appl. No. 12/115,776.
Office Action mail date Apr. 12, 2011 for U.S. Appl. No. 11/872,962.
Notice of Allowance and Fee(s) Due mail date May 11, 2011 for U.S. Appl. No. 11/872,962.
Communication pursuant to Article 94(3) EPC for EP 09 742 415.4 dated May 20, 2011, which corresponds to U.S. Appl. No. 12/115,776.
Form PCT/IB/326, Form PCT/IB/373, and Form PCT/ISA/237 for PCT/IB2009/005186 dated May 26, 2011, which corresponds to U.S. Appl. No. 12/270,189.
Final Office Action dated Jul. 6, 2011 for U.S. Appl. No. 12/270,256.
Form PCT/IB/326, Form PCT/IB/373, and Form PCT/ISA/237 for PCT/IB2009/005185 dated May 26, 2011, which corresponds to U.S. Appl. No. 12/270,256.
Final Office Action dated Jun. 8, 2011 for U.S. Appl. No. 12/482,189.
Form PCT/ISA/220, Form PCT/ISA/210, and Form PCT/ISA/237 for PCT/IB2010/003373 dated Jun. 14, 2011, which corresponds to U.S. Appl. No. 12/646,191.
U.S. Appl. No. 12/482,189, filed Jun. 10, 2009, Rahman et al.
Derwent Abstract of JP 10-273635 A generated May 17, 2010.
Office Action mail date Jul. 28, 2010 for U.S. Appl. No. 11/872,962.
Office Action mail date Jul. 12, 2010 for U.S. Appl. No. 12/115,776.
Office Action mail date May 26, 2010 for U.S. Appl. No. 12/060,307.
Office Action mail date Aug. 5, 2010 for U.S. Appl. No. 12/270,189.
387673, epoxy/hydroxyl functaionalized average MW-2.600, average mn-1,300, from http://www.sigmaaldrich.com/catalog/ProductDetail.do?lang=en&N4=387673|ALDRICH &N5=SEARCH_. . . , printed our May 24, 2010, 2 pages From SIGMA-ALDRICH catalog online.
Guo, at al., "Nanoimprint Lithography: Methods and Material Requirements**", Advanced Materials, vol. 19, pp. 495-513, 2007.
Communication pursuant to Article 94(3) EPC (EPO Form 2001) for EP 08 751 011.1 dated Aug. 11, 2010, which corresponds to U.S. Appl. No. 11/872,962.
Notice of Allowance and Fee(s) Due dated Oct. 1, 2010 for U.S. 12/060,307.
Office Action mail date Oct. 8, 2010 for U.S. Appl. No. 12/270,256.
Form PCT/ISA/220, Form PCT/ISA/210, and Form PCT/ISA/237 for PCT/IB2010/001401 dated Sep. 23, 2010, which corresponds to U.S. Appl. No. 12/482,189.
Office Action mail date Sep. 21, 2011 for U.S. Appl. No. 12/270,189.
Advisory Action mail dated Oct. 15, 2010 for U.S. Appl. No. 11/872,962.
Advisory Action mail dated Nov. 18, 2010 for U.S. Appl. No. 11/872,962.
Communication pursuant to Article 94(3) EPC (EPO Form 2001) for EP 08 751 011.1 dated Mar. 25, 2010, which corresponds to U.S. Appl. No. 11/872,962.
Form PCT/IB/326, Form PCT/IB/373, and Form PCT/ISA/237 for PCT/IB2009/005147 dated Nov. 18, 2010, which corresponds to U.S. Appl. No. 12/115,776.
Office Action dated. Nov. 9, 2010 for U.S. Appl. No. 12/332,501.
English Language Translation of Official Action mailed Sep. 25, 2012 for Japanese Patent Application No. 2010-508923.8, which corresponds to U.S. Appl. No. 11/872,962.
Notification of Second Office Action dated Oct. 29, 2012 for Chinese Patent Application No. 200880016844.8, which corresponds to U.S. Appl. No. 11/872,962.
English Language Translation of Notification of Second Office Action dated Oct. 29, 2012 for Chinese Patent Application No. 200880016844.8, which corresponds to US 11/872.
Form PCT/IB/326, Form PCT/IB/373, and Form PCT/ISA/237 for PCT/IB2010/001401 dated Dec. 22, 2011, which corresponds to U.S. Appl. No. 12/482,189.

* cited by examiner

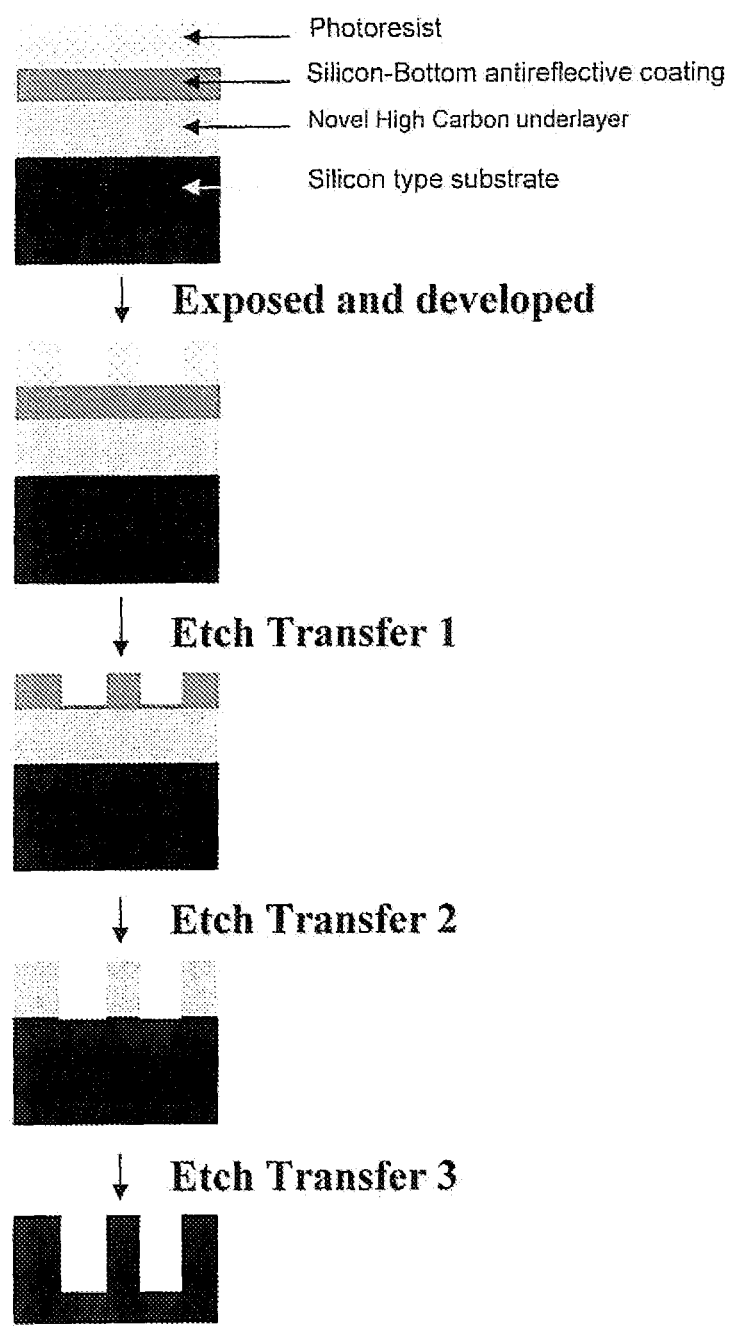
Imaging Process of a Trilayer

ANTIREFLECTIVE COATING COMPOSITION AND PROCESS THEREOF

The present invention relates to an absorbing hard mask antireflective coating composition comprising a polymer, where the polymer comprises in the backbone of the polymer at least one phenyl unit and at least one substituted or unsubstituted aromatic fused ring, and a process for forming an image using the antireflective coating composition. The process is especially useful for imaging photoresists using radiation in the deep and extreme ultraviolet (uv) region.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon based wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

Absorbing antireflective coatings and underlayers in photolithography are used to diminish problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes or interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete photoresist loss. An antireflective coating coated beneath a photoresist and above a reflective substrate provides significant improvement in lithographic performance of the photoresist. Typically, the bottom antireflective coating is applied on the substrate and then a layer of photoresist is applied on top of the antireflective coating. The antireflective coating is cured to prevent intermixing between the antireflective coating and the photoresist. The photoresist is exposed imagewise and developed. The antireflective coating in the exposed area is then typically dry etched using various etching gases, and the photoresist pattern is thus transferred to the substrate. Multiple antireflective layers and underlayers are being used in new lithographic techniques. In cases where the photoresist does not provide sufficient dry etch resistance, underlayers or antireflective coatings for the photoresist that act as a hard mask and are highly etch resistant during substrate etching are preferred, and one approach has been to incorporate silicon into a layer beneath the organic photoresist layer. Additionally, another high carbon content antireflective or mask layer is added beneath the silicon antireflective layer, which is used to improve the lithographic performance of the imaging process. The silicon layer may be spin coatable or deposited by chemical vapor deposition. Silicon is highly etch resistant in processes where $O_2$ etching is used, and by providing a organic mask layer with high carbon content beneath the silicon antireflective layer, a very large aspect ratio can be obtained. Thus, the organic high carbon mask layer can be much thicker than the photoresist or silicon layer above it. The organic mask layer can be used as a thicker film and can provide better substrate etch masking that the original photoresist.

The present invention relates to a novel organic spin coatable antireflective coating composition or organic mask underlayer which has high carbon content, and can be used between a photoresist layer and the substrate as a single layer of one of multiple layers. Typically, the novel composition can be used to form a layer beneath an essentially etch resistant antireflective coating layer, such as a silicon antireflective coating. The high carbon content in the novel antireflective coating, also known as a carbon hard mask underlayer, allows for a high resolution image transfer with high aspect ratio. The novel composition is useful for imaging photoresists, and also for etching the substrate. The novel composition enables a good image transfer from the photoresist to the substrate, and also reduces reflections and enhances pattern transfer. Additionally, substantially no intermixing is present between the antireflective coating and the film coated above it. The antireflective coating also has good solution stability and forms films with good coating quality, the latter being particularly advantageous for lithography.

SUMMARY OF THE INVENTION

The invention relates to an antireflective coating composition comprising a crosslinker and a crosslinkable polymer capable of being crosslinked by the crosslinker, where the crosslinkable polymer comprises a unit represented by structure (1):

where A is a fused aromatic ring and B has a structure (2),

where $R_1$ is $C_1$-$C_4$alkyl and $R_2$ is $C_1$-$C_4$alkyl

The invention further relates to a process for forming an image using the composition.

BRIEF DESCRIPTION OF DRAWINGS

FIG. 1 illustrates a process of imaging.

DETAILED DESCRIPTION OF THE INVENTION

The present invention relates to an absorbing antireflective coating composition comprising a crosslinker and a crosslinkable polymer capable of being crosslinked with the crosslinker, where the polymer comprises at least one unit with a phenyl group in the backbone of the polymer and at least one fused aromatic unit in the backbone of the polymer. The invention also relates to a process for imaging a photoresist layer coated above the novel antireflective coating layer.

The novel antireflective composition of the present invention comprises a novel polymer with high carbon content which is capable of crosslinking, such that the coating, formed from the composition after crosslinking, becomes insoluble in the solvent of the material coated above it. The novel coating composition is capable of self-crosslinking or may additionally comprise a crosslinking compound capable of crosslinking with the polymer. The composition may additionally comprise other additives, such as organic acids, esters, thermal acid generators, photoacid generators, surfactants, other high carbon content polymers etc. The composition may comprise additional polymers, especially those with high carbon content. The solid components of the novel composition are dissolved in an organic coating solvent composition, comprising one or more organic solvents. The novel polymer is soluble in the organic coating solvent(s).

The polymer of the novel composition comprises at least one unit of fused aromatic moiety and at least one unit with a phenyl moiety in the backbone of the polymer. The polymer may be represented by structure 1, $$\mathrm{-[A\text{-}B]-} \quad (1)$$

where A is a fused aromatic ring moiety and B has a structure (2),

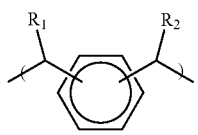

(2)

where $R_1$ is $C_1$-$C_4$alkyl and $R_2$ is $C_1$-$C_4$alkyl. The fused aromatic moiety comprises 2 or more aromatic units fused together. The fused aromatic moiety may comprise 2-8 aromatic rings or 2-6 aromatic rings or 3-5 aromatic rings or 3-4 aromatic rings. The fused aromatic ring may comprise 3 aromatic rings. The fused aromatic ring may be anthracyl.

The novel polymer may be obtained by a condensation reaction of a monomer comprising a phenyl moiety and a monomer comprising a fused aromatic group, in the presence of an acid catalyst. The fused aromatic moiety in the polymer comprises fused aromatic rings, which are substituted or unsubstituted. The fused aromatic rings of the polymer can comprise 2 to 8 membered aromatic rings. Examples of the fused aromatic moiety are the following structures 3-14.

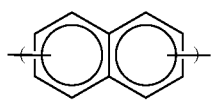

(3)

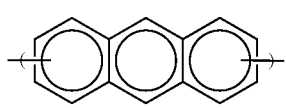

(4)

(5)

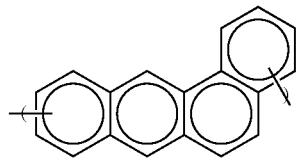

(6)

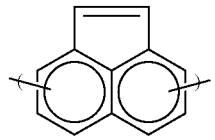

(7)

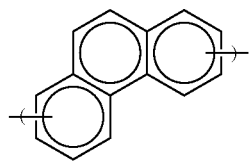

(8)

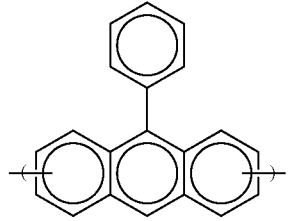

(9)

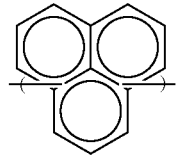

10

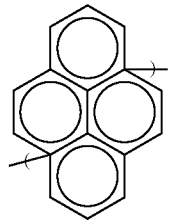

11

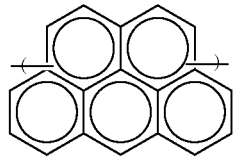

12

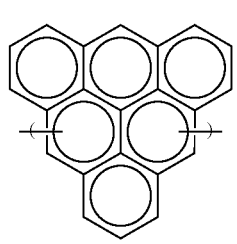

13

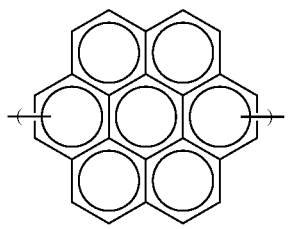

14

Although the unit may be as shown in structures 3-14, the fused rings may form the backbone of the polymer at any site in the aromatic structure and the attachment sites may vary within the polymer. The fused ring structure can have more than 2 points of attachment forming a branched oligomer or branched polymer. In one embodiment of the polymer, the fused aromatic unit is connected to another aromatic carbon moiety or another fused aromatic unit. Blocks of fused aromatic units may be formed and the blocks be separated by a saturated aliphatic carbon unit, such as methylene.

The fused aromatic rings of the polymer may be unsubstituted or substituted with one or more organo constituents, such as alkyl, substituted alkyl, aryl, substituted aryl, alkylaryl, and haloalkyls, hydroxyl, amino, aminoalkyl, alkoxy, such as methyl, aminomethyl, bromomethyl, and chloromethyl group. Up to 4 substituents may be present. The substituents on the aromatic rings may aid in the solubility of the polymer in the coating solvent. Some of the substituents on the fused aromatic structure may also be thermolysed during curing, such that they may not remain in the cured coating and thus give a high carbon content film useful during the etching process.

The polymer may comprise more than one type of the fused aromatic structures described herein. In one embodiment the fused aromatic moiety is unsubstituted. In one embodiment the fused aromatic moiety is free of hydroxy or alkoxy groups. In another embodiment the fused aromatic moiety of A and the phenyl group of B is unsubstituted, that is substituted only with hydrogen.

In addition to the fused ring unit, the polymer of the novel antireflective coating further comprises at least one unit, B, shown in structure 1 which comprises a phenyl group. The unit B may be derived from a monomer comprising 2 unsaturated groups, such as alkyl substituted or unsubstituted divinyl benzene. The polymer comprise units, -(A)- and —(B)—, where A is any fused aromatic unit described previously, which may be linear or branched, substituted or unsubstituted and where B is phenyl group which is connected to A through a saturated carbon, as shown in structure 2.

Aryl or aromatic groups contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, and the like. Alkoxy means straight or branched chain alkoxy having 1 to 20 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy. Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenylpropyl, and the like. Appropriate combinations of substituted aralkyl groups as described herein having desirable valence may be used as a polyvalent aralkyl group.

In one embodiment the novel polymer is free of any aliphatic cyclic or polycyclic groups, such as cyclohexyl, adamantyl, norbornyl, etc. In another embodiment the novel polymer is free of any aliphatic cyclic or polycyclic groups, hydroxy or alkoxy group. In one embodiment no polymer in the composition comprises an aliphatic polycyclic group, such as cyclohexyl, adamantyl, nornornyl, etc.

The polymer of the present novel composition may be synthesized by reacting a) at least one aromatic compound comprising 2 or more fused aromatic rings capable of electrophilic substitution such that the fused rings form the backbone of the polymer, with b) at least one aromatic unit with two active sites which can form carbocations, in the presence of an acid catalyst. The aromatic compound may be selected from monomers that provide the desired aromatic unit, more specifically structures shown above or equivalents, and may be further selected from compounds such as anthracene, phenanthrene, pyrene, fluoranthene, coronene triphenylene, anthracene methanol, anthracene methylmethoxy, etc. The fused aromatic rings provide at least 2 reactive sites which are sites for electrophilic substitution.

The monomer used to form unit B in the novel polymer comprises a phenyl unit with two reactive sites which are capable of forming carbocations in the presence of an acid, and may be selected from compounds such as divinyl benzene. The reaction is catalysed in the presence of a strong acid, such as a sulfonic acid. Any sulfonic acid may be used, examples of which are triflic acid, nonafluorobutane sulfonic acid, bisperfluoroalkylimides, trisperfluoroalkylcarbides, or other strong normucleophilic acids. The reaction may be carried out with or without a solvent. If a solvent is used then any solvent capable of dissolving the solid components may be used, especially one which is nonreactive towards strong acids; solvents such as chloroform, bis(2-methoxyethyl ether), nitrobenzene, methylene chloride, and diglyme, triglyme, di(ethyleneglycol)dimethylether, di(ethyleneglycol)diethylether, di(propyleneglycol)dimethylether, di(propyleneglycol)diethyl ether, propylene glycol monomethy ether acetate (PGMEA), propylene glycol monomethyl ether (PGME) may be used. The reaction may be mixed for a suitable length of time at a suitable temperature, till the polymer is formed. The reaction time may range from about 3 hours to about 24 hours, and the reaction temperature may range from about 80° C. to about 180° C. The polymer is isolated and purified in appropriate solvents, such as methanol, hexane, heptane through precipitation and washing. The novel polymer may be fractionated to obtain a fraction with the desired molecular weight. The polymer is dissolved in a solvent, for example tetrahydrofuran (THF); a nonsolvent is added to the solution such as an alkane; and a precipitate is formed and filtered. The process of fractionation may be carried out at room temperature. The polymer may be further purified. Typically the low molecular weight portion is removed. Previously known techniques of reacting, isolating and purifying the polymer may be used. The weight average molecular weight of the polymer can range from about 1200 to about 5,000, or about 1300 to about 3,000 or about 1,500 to about 2,600.

The refractive indices of the polymer, n (refractive index) and k (absorption) can range from about 1.3 to about 2.0 for the refractive index and about 0.05 to about 1.0 for the absorption at the exposure wavelength used, such as 193 nm. The carbon content of the polymer or the composition is determined by elemental analysis of the solid composition. The carbon content of the composition or polymer can be measured after forming a coating on a substrate and drying the film. Performing an elemental analysis on the solid coating or dry polymer provides the carbon content as weight %. The carbon content of the polymer or composition after crosslinking is greater than 80 weight % as measured by elemental analysis, or greater than 85 weight %, or greater than weight 90%. In one embodiment the carbon content of the polymer after crosslinking is in the range 80-95 weight %

The polymer of the present novel composition may have the structural unit as shown in structure (15), where $R_1$ and $R_2$ are as previously described.

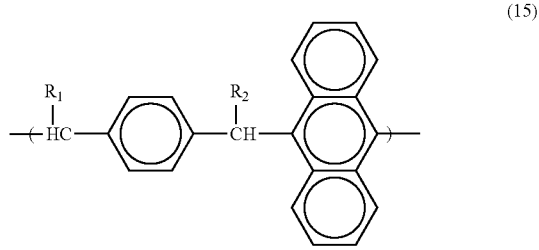

(15)

The novel composition of the present invention comprises the polymer and may further comprise a crosslinker. Typically the crosslinker is a compound that can act as an electrophile and can, alone or in the presence of an acid, form a carbocation. Thus compounds containing groups such as alcohol, ether, ester, olefin, methoxymethylamino, methoxymethylphenyl and other molecules containing multiple electrophilic sites, are capable of crosslinking with the polymer. Polymeric crosslinkers may be used, such as polymers of glycoluril, melamine, etc. Examples of compounds which can be crosslinkers are, 1,3 adamantane diol, 1,3,5 adamantane triol, polyfunctional reactive benzylic compounds, tetramethoxymethyl-bisphenol (TMOM-BP) of structure (16), aminoplast crosslinkers, glycolurils, Cymels, Powderlinks, etc.

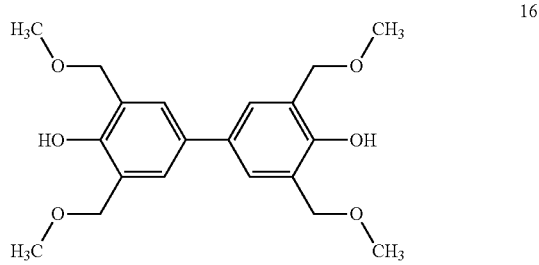

16

The novel composition comprising the polymer may also comprise an acid generator, and optionally a crosslinker. The acid generator can be a thermal acid generator capable of generating a strong acid upon heating. The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylalkylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoroalkylsulfonyl)methide, diaryliodonium bis(fluoroalkylsulfonyl)imide, diaryliodonium quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The novel composition may further contain at least one of the known photoacid generators, examples of which without limitation, are onium salts, sulfonate compounds, nitrobenzyl esters, triazines, etc. The preferred photoacid generators are onium salts and sulfonate esters of hydroxyimides, specifically diphenyl iodonium salts, triphenyl sulfonium salts, dialkyl iodonium salts, triakylsulfonium salts, and mixtures thereof. These photoacid generators are not necessarily photolysed but are thermally decomposed to form an acid.

The antireflection coating composition of the present invention may contain 1 weight % to about 30 weight % of the novel fused aromatic polymer, and preferably 4 weight % to about 15 weight %, of total solids in the composition. The crosslinker, when used in the composition, may be present at about 1 weight % to about 30 weight % of total solids. The thermal acid generator, may be incorporated in a range from about 0.1 to about 10 weight % by total solids of the antireflective coating composition, preferably from 0.3 to 5 weight % by solids, and more preferably 0.5 to 2.5 weight % by solids.

The novel composition may further comprise a second polymer. The second polymer can be one which also has carbon content greater than 75 weight %, or greater than 80 weight %. The second polymer may comprise a unit containing a fused aromatic ring, A, as described herein, a phenyl moiety, B, and a third unit selected from a substituted fused aromatic ring with greater than 2 aromatic rings. The third unit may be selected from a fused aromatic substituted with a hydroxy group. The third unit may be selected from hydroxyanthracyl moiety, hydroxyphenyl moiety, hydroxynaphthyl moiety, hydroxy pyrenyl moiety, $C_1$-$C_4$alkoxy anthracyl moiety, $C_1$-$C_4$ alkyl phenyl moiety, $C_1$-$C_4$ alkyl naphthyl moiety, $C_1$-$C_4$ alkyl pyrenyl moiety, etc. The third unit may be selected from hydroxyphenyl, hydroxynaphthyl, hydroxyphenanthryl, hydroxyanthracyl, etc. The third unit may be hydroxynaphthyl group. The second polymer may be added to the composition ranging from 1 weight % to 20% by weight of the total polymer concentration in the composition, or 1% to 10% by weight of the total polymer concentration. In one embodiment the second polymer is free of any aliphatic cyclic polycyclic groups. In another embodiment the second polymer is free of any aliphatic cyclic polycyclic groups and the third unit is a hydroxynaphthyl group.

In one embodiment the novel composition comprises the novel polymer, a second polymer described herein, a crosslinker, a thermal acid generator, optional surfactant and solvent(s).

The solid components of the antireflection coating composition are mixed with a solvent or mixtures of solvents that dissolve the solid components of the antireflective coating. Suitable solvents for the antireflective coating composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The antireflective coating composition may comprise other components to enhance the performance of the coating, e.g. monomeric dyes, lower alcohols ($C_1$-$C_6$ alcohols), surface leveling agents, adhesion promoters, antifoaming agents, etc.

Since the antireflective film is coated on top of the substrate and is also subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The absorption parameter (k) of the novel composition ranges from about 0.05 to about 1.0, preferably from about 0.1 to about 0.8 at the exposure wavelength, as derived from ellipsometric measurements. In one embodiment the composition has a k value in the range of about 0.2 to about 0.5 at the exposure wavelength. The refractive index (n) of the antireflective coating is also optimized and can range from about 1.3 to about 2.0, preferably 1.5 to about 1.8. The n and k values can be calculated using an ellipsometer, such as the J. A. Woollam WVASE VU-32™ Ellipsometer. The exact values of the optimum ranges for k and n are dependent on the exposure wavelength used and the type of application. Typically for 193 nm the preferred range for k is about 0.05 to about 0.75, and for 248 nm the preferred range for k is about 0.15 to about 0.8.

The carbon content of the novel antireflective coating composition is greater than 80 weight % or greater than 85 weight % as measured by elemental analysis of the dried film made from the composition. The carbon content of the film derived from the composition is maintained at a level of 80 weight % or greater than 80 weight % even after the film from the novel composition has been heated to temperatures up to 400° C. for up to 120 seconds.

The antireflective coating composition is coated on the substrate using techniques well known to those skilled in the art, such as dipping, spin coating or spraying. The film thickness of the antireflective coating ranges from about 15 nm to about 400 nm. The coating is further heated on a hot plate or convection oven for a sufficient length of time to remove any residual solvent and induce crosslinking, and thus insolubilizing the antireflective coating to prevent intermixing between the antireflective coating and the layer to be coated above it. The preferred range of temperature is from about 90° C. to about 280° C.

Other types of antireflective coatings may be coated above the coating of the present invention. Typically, an antireflective coating which has a high resistance to oxygen etching, such as one comprising silicon groups, such as siloxane, functionalized siloxanes, silsesquioxanes, or other moieties that reduce the rate of etching, etc., is used so that the coating can act as a hard mask for pattern transference. The silicon coating can be spin coatable or chemical vapor deposited. In one embodiment the substrate is coated with a first film of the novel composition of the present invention and a second coating of another antireflective coating comprising silicon is coated above the first film. The second coating can have an absorption (k) value in the range of about 0.05 and 0.5. A film of photoresist is then coated over the second coating. The imaging process is exemplified in FIG. 1.

A film of photoresist is coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating substantially absorb at the exposure wavelength used for the imaging process.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure at 193 nm and 157 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. The novel coatings can also be used in nanoimprinting and e-beam lithography.

After the coating process, the photoresist is imagewise exposed with a mask. The exposure may be done using typical exposure equipment. Examples of exposure wavelength sources are 248 nm and 193 nm, although any source may be used. The exposed photoresist is then developed in an aqueous developer to remove the treated photoresist. The developer is preferably an aqueous alkaline solution comprising, for example, tetramethyl ammonium hydroxide (TMAH). Example of a developer is 0.26N aqueous tetramethyl ammonium hydroxide (TMAH) solution. The developer may further comprise surfactant(s). An optional heating step can be incorporated into the process prior to development and after exposure.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings, with the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the carbon hard mask antireflective coating in the Examples below were measured on a J. A. Woollam VASE32 ellipsometer.

The molecular weight of the polymers was measured on a Gel Permeation Chromatograph.

Example 1

9-Anthracenemethanol (52.06 g~0.25 mole), divinylbenzene (16.3 g~0.125 mole), were taken in a 2 Liter four neck round bottom flask, equipped with a stirrer, condenser, Thermo watch and nitrogen sweep. 213 g of di(ethyleneglycol)dimethylether (diglyme), and 60 g of cyclopentyl methyl ether (CPME) was added and mixed for 10 minutes under nitrogen. 2.05 g of trifluoromethane sulphonic acid was added and mixed for 10 minutes. The flask was heated to 140° C. and refluxed for three hours. After the reaction, the flask was cooled and 500 ml CPME added. The reaction mixture was transferred to 5 L flask with a bottom outlet valve. 300 mL deionized (DI) water was added, mixed and allowed to settle to form a separate water layer. The polymer solution was mixed with 5 L hexane. The precipitate was filtered, washed with hexane and dried under vacuum. The crude polymer (46.0 g) was dissolved in tetrahydrofuran (THF) (400 ml). The solution was added to 4 liters of hexane and a precipitate was formed. The precipitate of the polymer was filtered and washed with hexane, and dried under vacuum to give a yield of 54% yield, GPC Mw of 1898 and polydispersity (Pd) of 1.77. The polymer as obtained had an elemental analysis by weight of Carbon-92.29%, Hydrogen-5.91%, Oxygen-1.8%

Example 2

7.0 g of the polymer from Example 1, 0.70 g of tetramethoxymethyl-bisphenol (TMOM-BP), 2.80 g of dodecylbenzenesulphonic acid with triethyl amine as a salt at 10% solution in cyclohexanone/PGMEA (70/30) and 89.5 g of cyclohexanone/PGMEA (70/30) were mixed. After complete mixing the formulation was filtered through a 0.04 µm filter.

Example 3

This filtered solution from Example 2 was spin-coated on an 8" silicon wafer at 1500 rpm. The coated wafer was baked on a hotplate at 230° C. for 60 seconds. The thin coated material was scraped out from the wafer surface by a blade and elemental analysis was done. The results are shown in the Table 1. Another silicon wafer was spin-coated with the filtered solution from Example 2 at 1500 rpm and the coated wafer was baked at 400° C. for 120 seconds. The baked material was scraped out from the wafer surface by a blade and elemental analysis was done. The results are shown in the Table 1.

TABLE 1

| | Composition from Example 2 | | |
| --- | --- | --- | --- |
| | Carbon (%) | Hydrogen (%) | Oxygen (%) |
| Bake at 230° C. for 60 seconds | 91.52 | 6.03 | 2.45 |
| Bake at 400° C. for 120 seconds | 83.41 | 3.48 | 13.11 |

Comparative Example 1

Example 2 was repeated with dihydroxymethyl benzene instead of divinyl benzene. The polymer obtained gave a 60% yield, GPC Mw of 1374 and Pd of 1.79, elemental analysis by weight: Carbon, 90.60%, Hydrogen, 5.15, Oxygen, 2.53%.

Comparative Example 2

Example 2 was repeated with polymer from comparative example 1.

Comparative Example 3

Example 3 was repeated with material from comparative example 2 and the results are shown in Table 2 below.

TABLE 2

| | Sample from comparative example 2 | | |
| --- | --- | --- | --- |
| | Carbon (%) | Hydrogen (%) | Oxygen (%) |
| Bake at 230° C. for 60 seconds | 91.62 | 5.55 | 2.83 |
| Bake at 400° C. for 120 seconds | 78.33 | 3.17 | 18.5 |

The comparative composition 2 gave lower carbon content after heating to 400° C. as compared to the composition of Example 2, where higher carbon content after baking is desirable, especially greater than 80 weight %.

Comparative Example 4

Example 1 was repeated with dimethoxymethyl benzene instead of divinylbenzene.
The polymer obtained gave Mw of 1374, Pd of 1.79. The polymer from elemental analysis had Carbon, 90.60%, Hydrogen, 5.15%, and Oxygen, 4.25% by weight.

Comparative Example 5

The comparative example 2 was repeated with polymer from comparative example 4

Comparative Example 6

Comparative example 3 was repeated with solution from comparative example 5 and the results are shown below in Table 3.

TABLE 3

| | Sample from comparative example 5 | | |
| --- | --- | --- | --- |
| | C (%) | H (%) | O (%) |
| Bake at 230° C. for 60 seconds | 91.02 | 5.45 | 3.53 |
| Bake at 400° C. for 120 seconds | 77.63 | 3.27 | 19.1 |

The comparative composition 5 gave lower carbon content after heating to 400° C. as compared to the composition of Example 2, where higher carbon content after baking is desirable.

Example 8 n and k Measurement: The formulation from Example 2 was adjusted to 1.25% solids by weight with cyclohexanone and the mixture was allowed to mix until all the materials become soluble. The homogeneous solution was filtered through a 0.2 μm membrane filter. This filtered solution was spin-coated on a 4" silicon wafer at 2000 rpm. The coated wafer was baked on hotplate at 230° C. for 60 seconds. Then, n and k values were measured with a VASE Ellipsometer manufactured by J. A. Woollam Co. Inc. The optical constants, n and k, of the film for 193 nm radiation were, n=1.47, k=0.56.

Example 9

The homogeneous solution from Example 2 was filtered with 0.2 μm membrane filter. This filtered solution was spin-coated on a 6" silicon wafer at 1500 rpm. The coated wafer was baked on hotplate at 230° C. for 60 seconds. After baking, the wafer was cooled to room temperature and partially submerged in PGME for 30 seconds. The coating was defect free. The submerged and unsubmerged regions of the wafer were examined for changes in film thickness. Due to effective cross linking of the baked film, no film loss was observed in the submerged region.

Example 10

The isothermal thermogravametric analysis, TGA, of the polymer from Example 1 was measured at 400° C. for 120 minutes under air using Perkin Elmer TGA 7 and the results showed that the weight loss of the polymer was 2.27%, thus showing that the novel polymer had very minimal weight loss.

Example 11

Blanket etch rates of the antireflective coatings were measured on a NE-5000 N (ULVAC) using both an oxidative (oxygen rich) and a fluorocarbon-rich etch condition outlined in Table 4. The antireflective coating films of formulations, from Example 2 and Comparative Example 2, with about 250 nm thickness were coated separately on 8" silicon wafers and baked at 230° C. for 1 minute. Individual film thickness measuring programs on a Nanospec 8000 using Cauchy's material-dependent constants derived by VASE analysis of the films and a 5 point inspection were performed before and after a 20 second etch. Etch rates were then calculated by taking the film thickness difference divided by etch times. The etch rate masking potential is shown in the etch rate data in Table 5 and Table 6. The Comparative example 2 gave a higher etch rate than Example 2, where a lower etch rate is desirable.

TABLE 4

Etch conditions used in the blanket etch rate studies

| | Etch condition | |
|---|---|---|
| | Oxidative condition | Fluorocarbon condition |
| Gas | Cl$_2$/O$_2$/Ar, 24/6/25 SCCM | CF$_4$/O$_2$/Ar, 50/20/150 SCCM |
| Process Pressure | 1.6 Pa | 5 Pa |

Plate temperature: 20° C.; RF power: 500 W with 50 W bias.

TABLE 5

Etch rate using Oxidative condition

| Formulation | Etch rate (nm/min) |
|---|---|
| Example 2 | 264.00 |
| Comparative Example 2 | 290.00 |

TABLE 6

Etch rate using Fluorocarbon condition

| Formulation | Etch rate (nm/min) |
|---|---|
| Example 2 | 169.00 |
| Comparative Example 2 | 200.00 |

Example 12

An 8 inch wafer was coated with the composition from Example 2 to give a 200 nm film thickness at 1500 rpm, and baked at 350° C. for 120 second. A silicon containing bottom antireflective coating, AZ® EXP ArF S24H (a silicon antireflective coating available from AZ® Electronic Materials USA Corps, Somerville, N.J.) was coated on top of it, to give a 31 nm film thickness and baked at 230° C. for 60 second. AZ® ArF2110P photoresist (a 193 nm photoresist available from AZ® Electronic Materials USA Corps, Somerville, N.J.) was then coated on top of the antireflective coatings to give a 125 nm film thickness and soft baked at 100° C. for 60 seconds. The photoresist was exposed imagewise using a 193 nm exposure tool (Nikon NSR-306D: NA=0.85, Dipole 0.82/0.43), baked at 110° C. for 60 seconds and then developed in 0.26N aqueous tetramethyl ammonium hydroxide (TMAH) solution. The line and space patterns were then observed on a scanning electron microscope and a pattern with critical dimension of 50 nm, with a 1:2 pitch was analyzed. The photoresist had a photosensitivity of 48.0 mJ/cm$^2$. The photoresist pattern had a good pattern profile with no footing or scum at the bottom of the photoresist pattern. The photoresist pattern had no standing waves showing minimal reflectivity from the substrate into the pattern. The photoresist pattern can be transferred to the substrate using the etch conditions described previously or other optimum conditions. The pattern specimen is etched using CF$_4$ gas, and thereafter O$_2$ is used to remove all remaining organic materials. Then the substrate is etched with CF$_4$ gas. The cross section of the pattern is observed by scanning electron microscope (SEM).

Example 13

9-Anthracenemethanol (166.6 g~0.80 mole) and divinylbenzene (16.3 g~0.125 mole) were added to a 2 Liter four neck round bottom flask, equipped with stirrer, condenser, Thermo watch and nitrogen sweep. 500 g of di(ethyleneglycol)dimethylether (DIGLYME) and 150 g of cyclopentyl methyl ether were added and mixed for 10 minutes under nitrogen. 6.5 g of trifluoromethane sulphonic acid was added and mixed for 10 minutes. The flask was heated to 140° C. and refluxed for three hours. After the reaction, the flask was cooled and 500 ml CPME was added. 400 mL deionized (DI) water was added, mixed and allowed to settle to form a separate water layer. The water layer was removed. The polymer solution was mixed with 8 L of hexane. The precipitate was filtered, washed with hexane and dried under vacuum. The crude polymer (154 g) was dissolved in tetrahydrofuran (1386 g). To this solution 824 g of hexane was added slowly with stirring and a precipitate was formed. The precipitate was filtered and washed with hexane, and dried under vacuum to give a yield of 38% of fractionated polymer; GPC Mw of 2162 of and polydispersity (Pd) of 1.83.

Example 14

Example 2 was repeated with the polymer from example 13.

Example 15

Example 3 was repeated with the composition from example 14 and the results are shown in Table 8.

TABLE 8

| | Composition from example 14 | | |
|---|---|---|---|
| | Carbon (%) | Hydrogen (%) | Oxygen (%) |
| Bake at 230° C. for 60 seconds | 92.33 | 5.77 | 1.9 |
| Bake at 400° C. for 120 seconds | 83.78 | 3.48 | 12.74 |

Example 16

9-Anthracenemethanol (26 g~0.125 mole), divinylbenzene (16.25 g~0.125 mole), and 1-naphthol (18 g, 0.125 mole) were added to a 2 Liter four neck round bottom flask, equipped with stirrer, condenser, Thermo watch and nitrogen sweep. 210 g of diglyme and 60 g of cyclopentyl methyl ether were added, mixed for 10 minutes under nitrogen. 1.81 g of trifluoromethane sulphonic acid was added and mixed for 10 minutes. The flask was heated to 140° C. and refluxed for three hours. After the reaction, the flask was cooled to about 80° C. and 500 ml CPME and 1.3 g triethyl amine were added. The reaction mixture was transferred to a 5 L flask with bottom outlet valve. 300 mL DI water was added, mixed and allowed to settle, and a separate water layer was formed. The polymer solution was added to 3 L of hexane. The polymer precipitate was filtered, washed with hexane and dried under vacuum. The polymer (70.0 g) was dissolved in THF (200 ml). The solution was added to 3.0 liters of t-butylmethyl ether and a precipitate was formed. The precipitate was filtered and washed with hexane, and dried under vacuum. The polymer yield was 33%, GPC Mw of 5561, Pd of 2.04, elemental analysis: Carbon, 87.11%, Hydrogen, 5.95% Oxygen, 6.95.

Example 17

7.35 g of the fractionated polymer from Example 13 was added to a bottle, 1.84 g of polymer from example 16 was added, 0.37 g of TMOM-BP was added, 2.94 g of DBSA at 10% solution in cyclohexanone/PGMEA (70/30) was added, 0.50 g of FC-4430 (available from 3M Company, MN) in 70/30 cyclohexanone/PGMEA as 1% and 86.9 g of cyclohexanone/PGMEA (70/30) were added. After mixing the formulation was filtered through a 0.04 μm filter. This filtered solution was spin-coated on an 8" silicon wafer at 1500 rpm. The coated wafer was baked on hotplate at 230° C. for 60 seconds and inspected for defects. The coating was completely defect free.

Comparative Example 18

Example 17 was repeated without the polymer from example 17 and after inspection the coating was found to have coating defect.

The invention claimed is:

1. An antireflective coating composition comprising a crosslinker and a crosslinkable polymer capable of being crosslinked by the crosslinker, where the crosslinkable polymer comprises a unit represented by structure (1):

 (1)

where A is a fused aromatic ring comprising 3 to 5 fused aromatic rings and which further is unsubstituted or substituted with one or more organo constituents selected from the group consisting of alkyl, substituted alkyl, aryl, substituted aryl, alkylaryl, haloalkyls, hydroxyl, amino, aminoalkyl, and alkoxy, and B has a structure (2),

 (2)

where $R_1$ is $C_1$-$C_4$ alkyl and $R_2$ is $C_1$-$C_4$ alkyl, and where the composition further comprises an acid generator.

2. The composition of claim 1, where the polymer in the composition is free of aliphatic polycyclic moieties.

3. The composition of claim 1, where $R_1$ is methyl and $R_2$ is methyl.

4. The composition of claim 1, where the acid generator is a thermal acid generator.

5. The composition of claim 1, wherein the polymer has a weight average molecular weight of 1,200 to 10,000.

6. The composition of claim 1 further comprising a surfactant.

7. The composition of claim 1 further comprising a second polymer, where the second polymer comprises a hydroxyaromatic moiety.

8. The composition of claim 1 further comprising a second polymer, where the second polymer comprises a hydroxyaromatic moiety and is free of aliphatic polycyclics.

9. The composition of claim 1 having a carbon content of greater than 80 weight % by solid content.

10. The composition of claim 1, where A in structure 1 is selected from the group consisting of

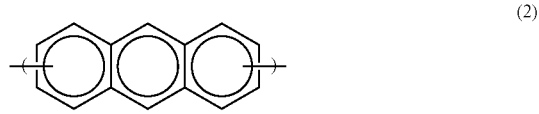 (2)

 (3)

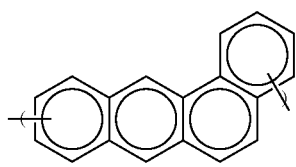 (4)

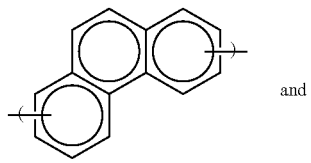 (6)

and

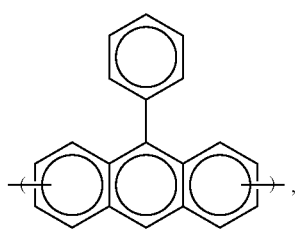 (7)

wherein one or more of these structures is present.

11. A process for manufacturing a microelectronic device, comprising;
a) providing a substrate with a first layer of an antireflective coating composition from claim 1;
b) optionally, providing at least a second antireflective coating layer over the first antireflective coating composition layer;
c) coating a photoresist layer above the antireflective coating layers;
d) imagewise exposing the photoresist layer with radiation in the deep and extreme ultraviolet (uv) region;
e) developing the photoresist layer with an aqueous alkaline developing solution.

12. The process of claim 11, where the first antireflective coating layer has k value as measured by ellipsometry in the range of about 0.05 to about 1.0.

13. The process of claim 11, where the second antireflective coating comprises silicon.

14. The process of claim 11, where the second antireflective coating layer has k value as measured by ellipsometry in the range of about 0.05 to about 0.5.

15. The process of claim 11, where the photoresist is imageable with radiation from about 240 nm to about 12 nm.

16. The process of claim 11 where the developing solution is an aqueous solution comprising a hydroxide base.

17. A process for manufacturing a microelectronic device, comprising:
a) providing a substrate with a first layer of an antireflective coating composition comprising a crosslinker and a crosslinkable polymer capable of being crosslinked by the crosslinker, where the crosslinkable polymer comprises a unit represented by structure (1):

―[A-B]― (1)

where A is a fused aromatic ring comprising 3 to 5 fused aromatic rings and which further is unsubstituted or substituted with one or more organo constituents selected from the group consisting of alkyl, substituted alkyl, aryl, substituted aryl, alkylaryl, haloalkyls, hydroxyl, amino, aminoalkyl, and alkoxy, and B has a structure (2),

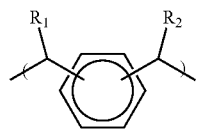

(2)

where $R_1$ is $C_1$-$C_4$alkyl and $R_2$ is $C_1$-$C_4$alkyl,
b) optionally, providing at least a second antireflective coating layer over the first antireflective coating composition layer;
c) coating a photoresist layer above the antireflective coating layers;
d) imagewise exposing the photoresist layer with radiation in the deep and extreme ultraviolet (uv) region;
e) developing the photoresist layer with an aqueous alkaline developing solution.

* * * * *